United States Patent
Yagita

(10) Patent No.: US 11,017,978 B2
(45) Date of Patent: May 25, 2021

(54) ION IMPLANTER AND BEAM PARK DEVICE

(71) Applicant: SUMITOMO HEAVY INDUSTRIES ION TECHNOLOGY CO., LTD., Tokyo (JP)

(72) Inventor: Takanori Yagita, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 16 days.

(21) Appl. No.: 16/681,080

(22) Filed: Nov. 12, 2019

(65) Prior Publication Data
US 2020/0152409 A1 May 14, 2020

(30) Foreign Application Priority Data
Nov. 13, 2018 (JP) .............................. JP2018-212925

(51) Int. Cl.
*H01J 37/04* (2006.01)
*H01J 37/317* (2006.01)

(52) U.S. Cl.
CPC .......... *H01J 37/04* (2013.01); *H01J 37/3171* (2013.01); *H01J 2237/055* (2013.01)

(58) Field of Classification Search
CPC ........ H01J 37/04; H01J 37/045; H01J 37/147; H01J 37/1472
See application file for complete search history.

(56) References Cited

U.S. PATENT DOCUMENTS

| 6,534,775 | B1* | 3/2003 | Harrington | ................ H01J 3/40 250/398 |
| 7,629,597 | B2 | 12/2009 | Tao et al. | |
| 7,851,772 | B2 | 12/2010 | Tsukihara et al. | |
| 8,519,353 | B2 | 8/2013 | Radovanov et al. | |
| 2008/0251713 | A1* | 10/2008 | Tsukihara | ........... H01J 37/3171 250/282 |

FOREIGN PATENT DOCUMENTS

| JP | 2005-150317 A | 6/2005 |
| JP | 2008-047536 A | 2/2008 |
| JP | 5242937 B2 | 7/2013 |
| JP | 2014-506385 A | 3/2014 |

* cited by examiner

*Primary Examiner* — Eliza W Osenbaugh-Stewart
(74) *Attorney, Agent, or Firm* — Michael Best & Friedrich LLP

(57) ABSTRACT

An ion implanter having a beam park device on the way of a beamline through which an ion beam is transported toward a wafer is provided. The beam park device includes a pair of park electrodes which faces each other across the beamline, and a beam dump which is provided away from the beamline in a facing direction of the pair of park electrodes and on a downstream side of the pair of park electrodes in a beamline direction. At least one of the pair of park electrodes includes a plurality of electrode bodies which are disposed to be spaced apart from each other in a predetermined direction perpendicular to both a direction in which the beamline extends and the facing direction, and each of the plurality of electrode bodies extends from an upstream side toward the downstream side in the beamline direction.

20 Claims, 7 Drawing Sheets

ION IMPLANTER AND BEAM PARK DEVICE

RELATED APPLICATIONS

The content of Japanese Patent Application No. 2018-212925, on the basis of which priority benefits are claimed in an accompanying application data sheet, is in its entirety incorporated herein by reference.

BACKGROUND

Technical Field

Certain embodiment of the present invention relates to an ion implanter and a beam park device.

Description of Related Art

In a semiconductor manufacturing process, a process (also referred to as ion implantation process) of implanting ions into a semiconductor wafer is generally performed for a purpose of changing a conductivity of a semiconductor, a purpose of changing a crystal structure of a semiconductor, or the like. In the ion implantation process, an ion implanter which transports an ion beam along a beamline extending toward the semiconductor wafer which is an implantation target is used. A beam park device may be provided on the way of the beamline to temporarily retract the ion beam from the beamline such that the semiconductor wafer is not irradiated with the ion beam. For example, as described in the related art, the beam park device includes a pair of park electrodes facing each other across the beamline and deflects the ion beam using an electric field applied between the park electrodes.

SUMMARY

According to an embodiment of the present invention, there is provided an ion implanter having a beam park device on the way of a beamline through which an ion beam is transported toward a wafer. The beam park device includes a pair of park electrodes which faces each other across the beamline, and a beam dump which is provided away from the beamline in a facing direction of the pair of park electrodes and on a downstream side of the pair of park electrodes in a beamline direction. At least one of the pair of park electrodes includes a plurality of electrode bodies which are disposed to be spaced apart from each other in a predetermined direction perpendicular to both a direction in which the beamline extends and the facing direction. Each of the plurality of electrode bodies extends from an upstream side toward the downstream side in the beamline direction.

According to another embodiment of the present invention, there is provided a beam park device which is disposed on the way of a beamline. This beam park device includes a pair of park electrodes which faces each other across the beamline, and a beam dump which is provided away from the beamline in a facing direction of the pair of park electrodes and on a downstream side of the pair of park electrodes in a beamline direction. At least one of the pair of park electrodes includes a plurality of electrode bodies which are disposed to be spaced apart from each other in a predetermined direction perpendicular to both a direction in which the beamline extends and the facing direction. Each of the plurality of electrode bodies extends from an upstream side toward the downstream side in the beamline direction.

DETAILED DESCRIPTION

Figure 1:
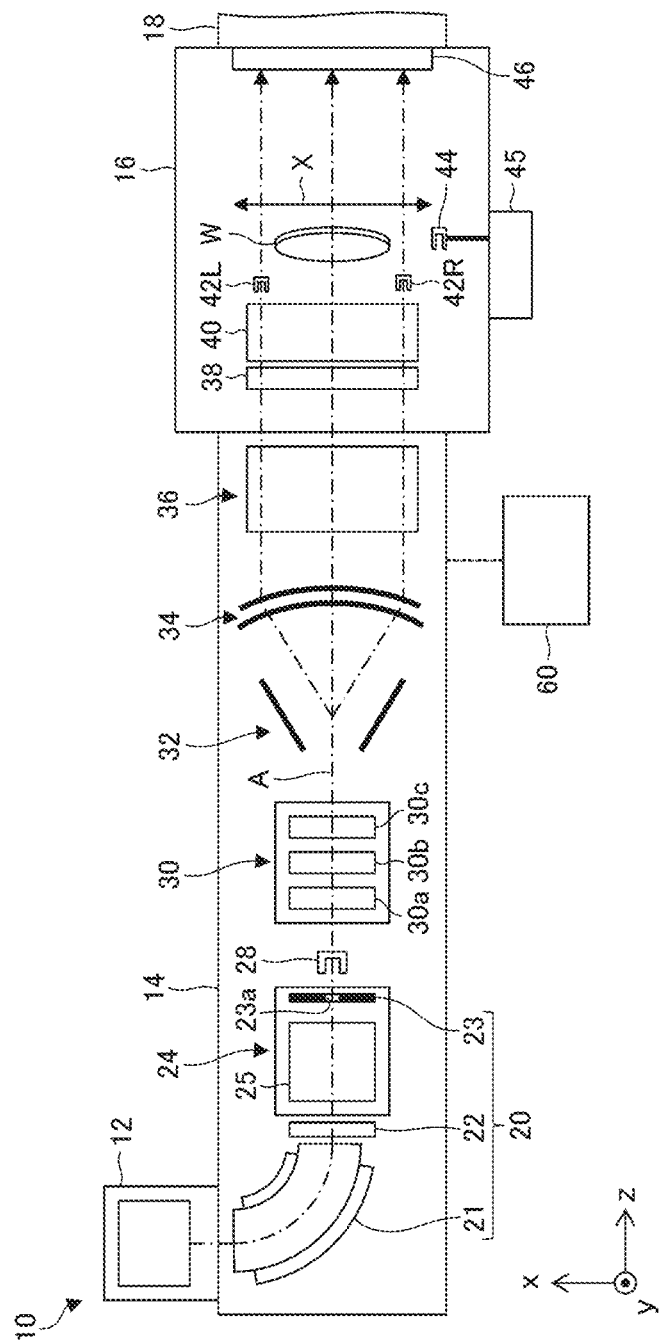
FIG. 1 is a top view showing a schematic configuration of an ion implanter according to an embodiment.

In a vacuum chamber through which an ion beam is transported, particles may be generated by various factors, and the particles may be attached to a surface of a park electrode. According to findings of the inventors, if a high voltage is applied to the park electrode to retract the ion beam in a state where the particles adhere to the surface of the park electrodes, a discharge is generated on the surface of the park electrode, and the particles on the surface of the park electrode may be scattered during the discharge. In a case where the particles are scattered toward a beamline, there is a concern that ion implantation into a semiconductor wafer may be affected by the scattering of the particles.

It is desirable to provide a technology for suppressing the scattering of the particles in the beam park device.

Aspects of the present invention include arbitrary combinations of the above-described elements and mutual substitution of elements or expressions of the present invention among apparatuses, methods, systems, or the like.

According to the present invention, it is possible to suppress the scattering of the particles in the beam park device.

Hereinafter, an embodiment of the present invention will be described in detail with reference to the drawings. In descriptions of the drawings, the same reference signs are assigned to the same elements, and repeated descriptions will be appropriately omitted. Configurations described below are mere exemplifications and do not limit a scope of the present invention.

Before the embodiment is described in detail, an outline of the present invention will be described. The present embodiment relates to an ion implanter having a beam park device on the way of a beamline through which an ion beam is transported toward a wafer. The beam park device includes a pair of park electrodes which faces each other across the beamline, and a beam dump which is provided away from the beamline in a facing direction of the pair of park electrodes and on a downstream side of the pair of park electrodes in a beamline direction. The beam park device uses an electric field applied between the park electrodes to deflect the ion beam and causes the ion beam to be incident into the beam dump deviated from the beamline such that the ion beam does not reach to the downstream side of the beam park device.

In a vacuum chamber through which an ion beam is transported, particles may be generated by various factors, and the particles may adhere to a surface of the above-described park electrode. According to findings of the inventors, if a high voltage is applied to the park electrode to retract the ion beam in a state where the particles adhere to the surface of the park electrodes, a discharge is generated on the surface of the park electrode, and the particles on the surface of the park electrode may be scattered during the discharge. In a case where the particles are scattered toward a beamline, there is a concern that ion implantation into a semiconductor wafer on the downstream side may be affected by the scattering of the particles. Therefore, in the present embodiment, a surface shape of the park electrode has a shape with which particles do not easily adhere. Specifically, the park electrode is constituted by a plurality of electrode bodies disposed to be spaced apart from each other in a predetermined direction such that particles fall in gaps between the electrode bodies. Accordingly, it possible to reduce a possibility that the particles remain on the electrode surface of the park electrode where discharge may occur, and it is possible to suppress scattering of the particles caused by the discharge.

Figure 2:
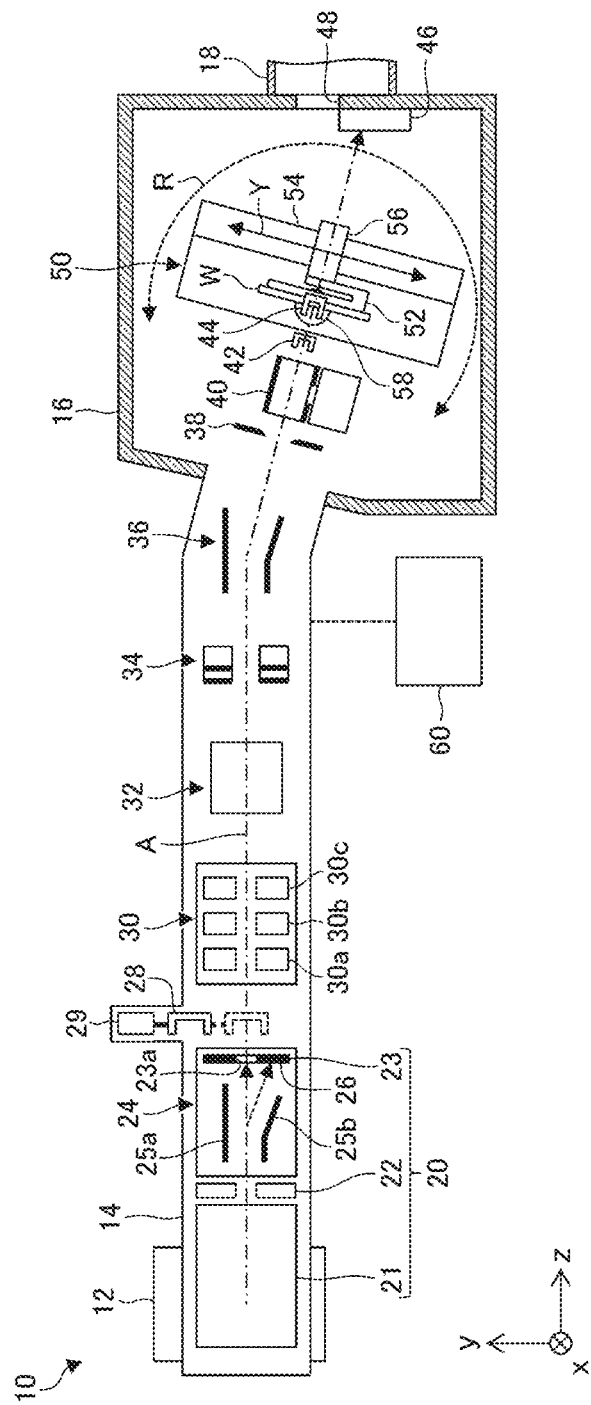
FIG. 2 is a side view showing the schematic configuration of the ion implanter of FIG. 1.

FIG. 1 is a top view showing a schematic configuration of an ion implanter 10 according to the embodiment, and FIG. 2 is a side view showing the schematic configuration of the ion implanter 10. The ion implanter 10 is configured to implant ions into a surface of a workpiece W. For example, the workpiece W is a substrate or a semiconductor wafer. Hereinafter, for convenience of explanation, in the present specification, the workpiece W is referred to as a wafer W. However, this is not intended to limit an implantation target to a specific object.

The ion implanter 10 is configured to reciprocatingly perform scanning in one direction with a beam and reciprocatingly move the wafer W in a direction perpendicular to a scanning direction such that the entire wafer W is irradiated with the ion beam B. In the present specification, for convenience of explanation, a traveling direction of the ion beam traveling along a designed beamline A is defined as a z direction and a plane perpendicular to the z direction is defined as a xy plane. In a case where the workpiece W is scanned with the ion beam, a scanning direction of the beam is referred to as an x direction, and a direction perpendicular to the z direction and the x direction is referred to as a y direction. Accordingly, the reciprocating scanning of the beam is performed in the x direction and the reciprocating movement of the wafer W is performed in the y direction.

The ion implanter 10 includes an ion source 12, a beamline unit 14, an implantation process chamber 16, and a wafer transfer device 18. The ion source 12 is configured to provide the ion beam to the beamline unit 14. The beamline unit 14 is configured to transport the ion beam from the ion source 12 to the implantation process chamber 16. The wafer W which is an implantation target is accommodated in the implantation process chamber 16, and the implantation by irradiating the wafer W with the ion beam provided from the beamline unit 14 is performed in the implantation process chamber 16. The wafer transfer device 18 is configured to load an unprocessed wafer, which is not subjected to the implantation, into the implantation process chamber 16 and unload a processed wafer, which is subjected to the implantation, from the implantation process chamber 16. The ion implanter 10 includes an evacuation system (not shown) for providing a desired vacuum environment to the ion source 12, the beamline unit 14, the implantation process chamber 16, and the wafer transfer device 18.

The beamline unit 14 includes a mass analyzer 20, a beam park device 24, a beam shaping unit 30, a beam scanning unit 32, a beam parallelizing unit 34, and an angular energy filter (AEF) 36 in this order from an upstream side of the beamline A. Here, the upstream side of the beamline A indicates a side close to the ion source 12, and a downstream side of the beamline A indicates a side close to the implantation process chamber 16 (or beam stopper 46).

The mass analyzer 20 is provided on the downstream side of the ion source 12 and is configured to select necessary ion species from the ion beam extracted from the ion source 12 by mass analysis. The mass analyzer 20 includes a mass analyzing magnet 21, a mass analyzing lens 22, and a mass analyzing slit 23.

The mass analyzing magnet 21 applies a magnetic field to the ion beam extracted from the ion source 12 to deflect the ion beam in different paths according a value of a mass-to-charge ratio M=m/q (m is mass and q is charge) of the ion. For example, the mass analyzing magnet 21 applies a magnetic field in the y direction (for example, −y direction) to the ion beam and deflects the ion beam in the x direction. A magnetic field strength of the mass analyzing magnet 21 is adjusted such that an ion species having a desired mass-to-charge ratio M passes through the mass analyzing slit 23.

The mass analyzing lens 22 is provided on a downstream side of the mass analyzing magnet 21 and is configured to adjust a focusing/defocusing force with respect to the ion beam. The mass analyzing lens 22 adjusts a focal position in a beam traveling direction (z direction) of the ion beam passing through the mass analyzing slit 23, and adjusts a mass resolution M/dM of the mass analyzer 20. The mass analyzing lens 22 is not an essential component, and the mass analyzer 20 may not have the mass analyzing lens 22.

The mass analyzing slit 23 is provided on a downstream side of the mass analyzing lens 22 and is provided at a position away from the mass analyzing lens 22. The mass analyzing slit 23 is configured such that a beam deflection direction (x direction) by the mass analyzing magnet 21 is a slit width, and has an opening 23a which is relatively small in the x direction and relatively large in the y direction.

The mass analyzing slit 23 may be configured to have a variable slit width so as to adjust the mass resolution. The mass analyzing slit 23 may be configured of two shields movable in a slit width direction, and may be configured such that the slit width can be adjusted by changing a gap between the two shields. The mass analyzing slit 23 may be configured such that the mass analyzing slit 23 is switched to any one of a plurality of slits having different slit widths to change the slit width.

The beam park device 24 is configured to temporarily retract the ion beam from the beamline A and block the ion beam traveling toward the implantation process chamber 16 (or wafer W) on the downstream side. The beam park device 24 can be disposed at any position on the way of the beamline A. However, for example, the beam park device 24 can be disposed between the mass analyzing lens 22 and the mass analyzing slit 23. A sufficient distance is required between the mass analyzing lens 22 and the mass analyzing slit 23. Accordingly, by disposing the beam park device 24 between the mass analyzing lens 22 and the mass analyzing slit 23, it is possible to shorten a length of the beamline A compared with a case where the beam park device 24 is disposed at another position, and it is possible to decrease a size of the entire ion implanter 10.

The beam park device 24 includes a pair of park electrodes 25 (25a and 25b) and a beam dump 26. The pair of park electrodes 25a and 25b face each other across the beamline A, and face each other in the direction (y direction) perpendicular to the beam deflection direction (x direction) of the mass analyzing magnet 21. The beam dump 26 is provided on the downstream side of the park electrodes 25a and 25b in a direction of the beamline A, and is provided away from the beamline A in a facing direction of the park electrodes 25a and 25b.

A first park electrode 25a is disposed above the beamline A in the gravity direction, and a second park electrode 25b is disposed below the beamline A in the gravity direction. The beam dump 26 is provided at a position downward away from the beamline A in the gravity direction, and is disposed below the opening 23a of the mass analyzing slit 23 in the gravity direction. For example, the beam dump 26 is formed in a portion where the opening 23a of the mass analyzing slit 23 is not formed. The beam dump 26 may be configured separately from the mass analyzing slit 23.

The beam park device 24 deflects the ion beam using an electric field applied between the pair of park electrodes 25a and 25b and retracts the ion beam from the beamline A. For example, by applying a negative voltage to the second park electrode 25b with reference to a potential of the first park electrode 25a, the ion beam is deflected downward from the beamline A in the gravity direction and is incident into the beam dump 26. In FIG. 2, a trajectory of the ion beam toward the beam dump 26 is indicated by a broken line. The beam park device 24 causes the ion beam passes along the beamline A to the downstream side by setting the pair of park electrodes 25a and 25b to be the same potential. The beam park device 24 is configured to be operable so as to be switched to a first mode in which the ion beam passes the downstream side and a second mode in which the ion beam is incident into the beam dump 26.

A Faraday cup 28 is provided on a downstream side of the mass analyzing slit 23. The Faraday cup 28 is configured to movable into or out of the beamline A by an operation of an injector drive unit 29. The injector drive unit 29 moves the Faraday cup 28 in a direction (for example, y direction) perpendicular to a direction in which the beamline A extends. In a case where the Faraday cup 28 is disposed on the beamline A as shown by broken lines in FIG. 2, the ion beam toward the downstream side is blocked. Meanwhile, in a case where the Faraday cup 28 is removed from the beamline A as shown by solid lines in FIG. 2, the blocking of the ion beam toward the downstream side is released.

The Faraday cup 28 is configured to measure a beam current of the ion beam mass-analyzed by the mass analyzer 20. The Faraday cup 28 can measure a mass analysis spectrum of the ion beam by measuring the beam current while changing the magnetic field strength of the mass analyzing magnet 21. The mass resolution of the mass analyzer 20 can be calculated using the measured mass analysis spectrum.

The beam shaping unit 30 includes a focusing/defocusing lens such as a quadrupole focusing/defocusing unit (Q lens) and is configured to shape the ion beam B having passed through the mass analyzer 20 into a desired cross-sectional shape. For example, the beam shaping unit 30 is constituted as an electric field type three-staged quadrupole lens (referred to as a triplet Q lens), and includes three quadrupole lenses 30a, 30b, and 30c. The beam shaping unit 30 can independently adjust convergence or divergence of the ion beam incident into the wafer W in each of the x direction and the y direction using the three lens units 30a to 30c. The beam shaping unit 30 may include a magnetic field type lens unit or may include a lens unit which shapes the beam using both an electric field and a magnetic field.

The beam scanning unit 32 is configured to provide the reciprocating scanning of the beam and is a beam deflection unit which performs scanning in the x direction with the shaped ion beam. The beam scanning unit 32 includes a scanning electrode pair facing each other in a beam scanning direction (x direction). The scanning electrode pair is connected to a variable voltage power supply (not shown). The beam scanning unit 32 periodically changes a voltage applied to between the scanning electrode pair to change an electric field generated between electrodes, and deflect the ion beam B in various angles. As a result, the scanning of the ion beam is performed over the entire scanning range in the x direction. In FIG. 1, the scanning direction and the scanning range of the beam are exemplified by an arrow X, and a plurality of trajectories of the ion beam in the scanning range are shown by one-dot chain lines.

The beam parallelizing unit 34 is configured to parallelize the traveling direction of the scanned ion beam and the trajectory of the designed beamline A to each other. The beam parallelizing unit 34 includes a plurality of arc-shaped parallelizing lens electrodes having a passing slit for the ion beam in a center portion of the beam parallelizing unit 34. Each of the parallelizing lens electrodes is connected to a high voltage power supply (not shown) and applies an electric field generated by a voltage application to the ion beam to parallelize the traveling direction of the ion beam. The beam parallelizing unit 34 may be replaced by other beam parallelizing units, and the beam parallelizing unit may be constituted as a magnet unit using a magnetic field.

An AD (Acceleration/Deceleration) column (not shown) for accelerating or decelerating the ion beam may be provided on the downstream side of the beam parallelizing unit 34.

The angular energy filter (AEF) 36 is configured to analyze energy of the ion beam, deflect ions having necessary energy downward, and introduce the ions to the implantation process chamber 16. The angular energy filter 36 includes an AEF electrode pair for deflection of the ion beam using an electric field. The AEF electrode pair is connected to the high voltage power supply (not shown). In FIG. 2, by applying a positive voltage to an upper AEF electrode and a negative voltage to a lower AEF electrode, the ion beam is deflected downward. The angular energy filter 36 may be constituted as a magnet unit for deflection of the ion beam using a magnetic field, or may be constituted by a combination of the AEF electrode pair for deflection using an electric field and the magnet unit for deflection using a magnetic field.

In this way, the beamline unit 14 supplies the ion beam with which the wafer W is to be irradiated to the implantation process chamber 16.

The implantation process chamber 16 includes an energy defining slit 38, a plasma shower device 40, a side cup 42, a center cup 44, and the beam stopper 46 in this order from the upstream side of the beamline A. As shown FIG. 2, a platen drive device 50 holding one or plurality of wafers W is included in the implantation process chamber 16.

An energy defining slit 38 is provided on a downstream side of the angular energy filter 36 and analyzes the energy of the ion beam incident into the wafer W together with the angular energy filter 36. The energy defining slit 38 is an energy defining slit (EDS) constituted by a slit long in the beam scanning direction (x direction). The energy defining slit 38 causes an ion beam having a desired energy value or energy range to pass through toward the wafer W and blocks other ion beams.

The plasma shower device 40 is located on a downstream side of the energy defining slit 38. The plasma shower device 40 supplies low energy electrons to the ion beam and a surfaces (wafer processing surface) of the wafer W according to the beam current of the ion beam, and suppresses charge-up due to a positive charge on the wafer processing surface introduced by the ion implantation. For example, the plasma shower device 40 includes a shower tube through which the ion beam passes, and a plasma generating device which supplies electrons into the shower tube.

The side cup 42 (42R, 42L) is configured to measure the beam current of the ion beam while ions are implanted to the wafer W. As shown in FIG. 2, the side cups 42R and 42L are disposed to be deviated right and left (in the x direction) with respect to the wafer W disposed on the beamline A and are disposed at positions at which the side cups 40R and 40L do not block the ion beam directed to the wafer W during the ion implantation. The scanning of the ion beam is performed in the x direction beyond a range in which the wafer W is located, and thus, a portion of the scanning beam is incident into the side cups 42R and 42L during the ion implantation. Accordingly, the beam current is measured by the side cups 42R and 42L during the ion implantation.

The center cup 44 is configured to measure the beam current on the wafer processing surface. The center cup 44 is configured to be movable by an operation of a drive unit 45, is retracted from an implantation position at which the wafer W is located during the ion implantation, and is inserted into the implantation position when the wafer W is not located at the implantation position. The center cup 44 measures the beam current while moving the x direction, and thus, can measure the beam current over the entire beam scanning range in the x direction. The center cup 44 may be formed in an array in which a plurality of Faraday cups are arranged in the x direction such that the beam currents at a plurality of positions in the beam scanning direction (x direction) can be measured at the same time.

At least one of the side cup 42 and the center cup 44 may include a single Faraday cup for measuring the beam current or may include an angle measuring instrument for measuring angle information of the beam. For example, the angle measuring instrument includes a slit and a plurality of current detection units provided away from the slit in the beam traveling direction (z direction). For example, an angular component of the beam in the slit width direction can be measured by measuring the beam having passed through the slit by the plurality of current detection units arranged in the slit width direction. At least one of the side cup 42 and the center cup 44 may include a first angle measuring instrument capable of measuring the angle information in the x direction and a second angle measuring instrument capable of measuring angle information in the y direction.

The platen drive device 50 includes a wafer holding unit 52, a reciprocating mechanism 54, a twist angle adjustment mechanism 56, and a tilt angle adjustment mechanism 58. The wafer holding unit 52 includes an electrostatic chuck or the like for holding the wafer W. The reciprocating mechanism 54 reciprocates the wafer holding unit 52 in a reciprocating direction (y direction) perpendicular to the beam scanning direction (x direction), and thus, the wafer held by the wafer holding unit 52 is reciprocated in the y direction. In FIG. 2, the reciprocation of the wafer W is exemplified by an arrow Y.

The twist angle adjustment mechanism 56 is a mechanism which adjusts a rotation angle of the wafer W, and rotates the wafer W with a normal line of the wafer processing surface as an axis to adjust a twist angle between an alignment mark and a reference position provided on an outer peripheral portion of the wafer. Here, the alignment mark of the wafer means a notch or an orientation flat which is provided on the outer peripheral portion of the wafer, and is a mark which serves as a reference for an angular position in a crystal axis direction of the wafer or in a circumferential direction of the wafer. The twist angle adjustment mechanism 56 is provided between the wafer holding unit 52 and the reciprocating mechanism 54 and is reciprocated together with the wafer holding unit 52.

The tilt angle adjustment mechanism 58 is a mechanism which adjusts an inclination of the wafer W and adjusts a tilt angle between the traveling direction of the ion beam toward the wafer processing surface and a normal line of the wafer processing surface. In the present embodiment, in inclination angles of the wafer W, an angle having an axis in the x direction as a central axis of the rotation is adjusted as the tilt angle. The tilt angle adjustment mechanism 58 is provided between the reciprocating mechanism 54 and an inner wall of the implantation process chamber 16 and is configured to rotate the entire platen drive device 50 including the reciprocating mechanism 54 in an R direction to adjust the tilt angle of the wafer W.

The platen drive device 50 holds the wafer W such that the wafer W can move between the implantation position at which the wafer W is irradiated with the ion beam and a transfer position at which the wafer W is loaded from or unloaded to the wafer transfer device 18. FIG. 2 shows a state where the wafer W is located at the implantation position and the platen drive device 50 holds the wafer W such that the beamline A and the wafer W intersect each other. The transfer position of wafer W corresponds to the position of the wafer holding unit 52 when the wafer W is loaded or unloaded through a transfer port 48 by a transfer mechanism or a transfer robot provided in the wafer transfer device 18.

The beam stopper 46 is provided on the most downstream side of the beamline A and is mounted on an inner wall of the implantation process chamber 16, for example. In a case where the wafer W does not exist on the beamline A, the ion beam is incident into the beam stopper 46. The beam stopper 46 is located near the transfer port 48 which connects the implantation process chamber 16 and the wafer transfer device 18 to each other, and is provided vertically below the transfer port 48.

The ion implanter 10 includes a central control unit 60. The central control unit 60 controls an overall operation of the ion implanter 10. In terms of hardware, the central control unit 60 is realized by elements such as a CPU or a memory of a computer or a mechanical device, and in terms of software, the central control unit 60 is realized by a computer program or the like. Accordingly, various functions provided by the central control unit 60 can be realized by cooperation of hardware and software.

Figure 3:
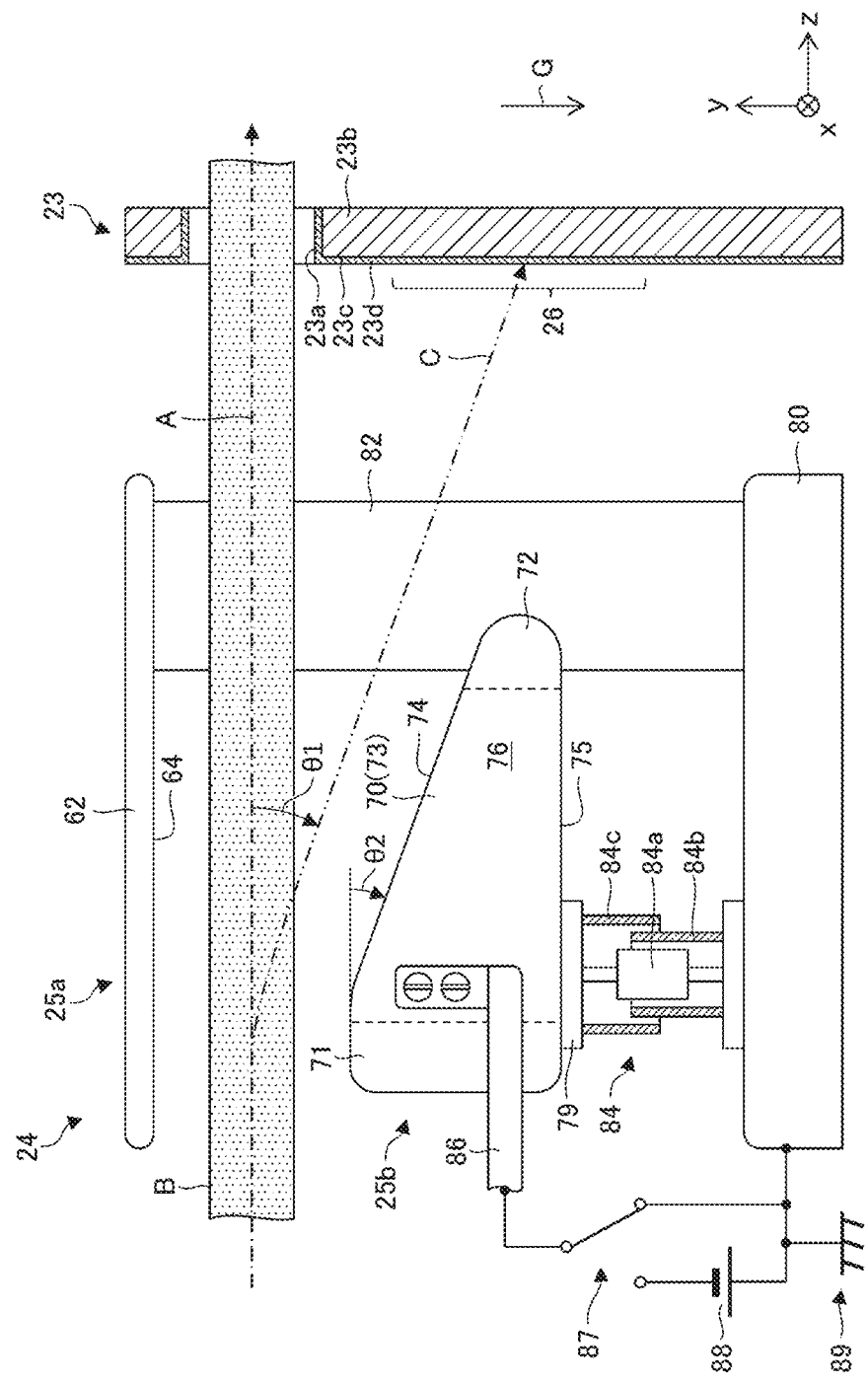
FIG. 3 is a side view showing a configuration of a beam park device in detail.

Subsequently, a configuration of the beam park device 24 will be described in detail. FIG. 3 is a side view showing the configuration of the beam park device 24 in detail. In FIG. 3, an up-down direction (y direction) viewed on the specification is parallel to a gravity direction G. Therefore, the first park electrode 25a is disposed on an upper side in the gravity direction, and the second park electrode 25b is disposed on a lower side in the gravity direction.

FIG. 3 shows the beam park device 24 operating in the first mode described above, and the ion beam B passing through a portion between the park electrodes 25a and 25b is directed to the downstream side of beamline A through the opening 23a of the mass analyzing slit 23. A base portion 23b of the mass analyzing slit 23 is formed of a material such as stainless steel or aluminum. A cover member 23d formed of graphite or the like is provided on a surface 23c of an upstream side of the mass analyzing slit 23 and the opening 23a facing the beam park device 24. By providing the cover member 23d, at least a portion of the mass analyzing slit 23 can function suitably as the beam dump 26.

Each of the first park electrode 25a and the second park electrode 25b is fixed with respect to the base plate 80. The base plate 80 is disposed below the first park electrode 25a and the second park electrode 25b in the gravity direction. The first park electrode 25a is supported by a first support member 82 which extends upward from the base plate 80 in the gravity direction. The second park electrode 25b is supported by a second support member 84 which extends upward from the base plate 80 in the gravity direction. Mounting positions of the first support member 82 and the second support member 84 are not particularly limited. For example, the first support member 82 can be provided at a position on a downstream side in the beamline A, and the second support member 84 can be provided at a position on an upstream side in the beamline A.

The first park electrode 25a is constituted by a flat plate 62 of a conductive member such as graphite or aluminum, and a first electrode surface 64 facing the second park electrode 25b is configured to be a flat surface. The flat plate 62 is disposed such that the first electrode surface 64 is along the beamline A. The flat plate 62 may be disposed such that the first electrode surface 64 is strictly parallel to the beamline A, or may be disposed such that an inclination angle of the first electrode surface 64 with respect to the beamline A is a small angle such as 5° or less and the first electrode surface 64 is approximately parallel to the beamline A. In order to prevent discharge between the first park electrode 25a and the second park electrode 25b, edges and corners of the flat plate 62 are R-chamfered.

The second park electrode 25b is formed of a conductive member such as graphite or aluminum. The second park electrode 25b is configured such that at least a portion of a second electrode surface 74 facing the first park electrode 25a is inclined with respect to the beamline A and approaches the beam dump 26 located below the opening 23a of the mass analyzing slit 23 away from the beamline A. An inclination angle θ2 of the second electrode surface 74 is the same as a beam deflection angle θ1 when the ion beam B is retracted toward the beam dump 26. For example, the inclination angle θ2 is set to be an angle of about 10° to 30°, preferably an angle of about 15° to 25°. Meanwhile, a bottom surface 75 of the second park electrode 25b is parallel to the beamline A. A mounting portion 79 for connecting the second support member 84 is provided at a position on an upstream side of the bottom surface 75 of the second park electrode 25b.

The second park electrode 25b has a main body 70, an upstream connecting portion 71, and a downstream connecting portion 72. The main body 70 is a portion having an electrode surface which is inclined with respect to the beamline A. The main body 70 is constituted by a plurality of electrode bodies 73 (electrode bodies 73a to 73f of FIG. 4 described later). The upstream connecting portion 71 is provided on an upstream side of the main body 70 and connects upstream ends of the plurality of electrode bodies 73 to each other. The downstream connecting portion 72 is provided on the downstream side of the main body 70 and connects downstream ends of each of the plurality of electrode bodies 73 to each other.

A power supply connection portion 86 is mounted on an outer peripheral surface 76 of the second park electrode 25b. The power supply connection portion 86 extends in the x direction from the outer peripheral surface 76 of the second park electrode 25b (refer to FIG. 4) and thereafter, extends toward the upstream side of the beamline A. The power supply connection portion 86 is connected to a power supply 88 or a ground 89 via the changeover switch 87. The changeover switch 87 is connected to the ground 89 in a case where the beam park device 24 is operated in the first mode and connected to a negative electrode of the power supply 88 in a case where the beam park device 24 is operated in the second mode. A positive electrode of the power supply 88 is connected to the ground 89.

The first park electrode 25a, the base plate 80, and the first support member 82 are configured to have the same potential, and are connected to the ground 89, for example. Meanwhile, a negative voltage with respect to the first park electrode 25a can be applied to the second park electrode 25b. Therefore, it is necessary to secure an electrical insulation between the second park electrode 25b and the base plate 80, and the second support member 84 includes an insulating member 84a such as insulator. Therefore, the second park electrode 25b and the base plate 80 are connected to each other via the insulating member 84a.

An inner insulating cover 84b and an outer insulating cover 84c are provided around the insulating member 84a. The inner insulating cover 84b extends from the base plate 80 toward the second park electrode 25b, and the outer insulating cover 84c extends from the second park electrode 25b toward the base plate 80. For example, each of the insulating covers 84b and 84c has a cylindrical shape and the insulating covers 84b and 84c are provided away from each other in the radial direction while partially overlapping each other in the axial direction (y direction). The insulating covers 84b and 84c prevent insulation deterioration of the insulating member 84a caused by adhesion of contamination.

Figure 4:
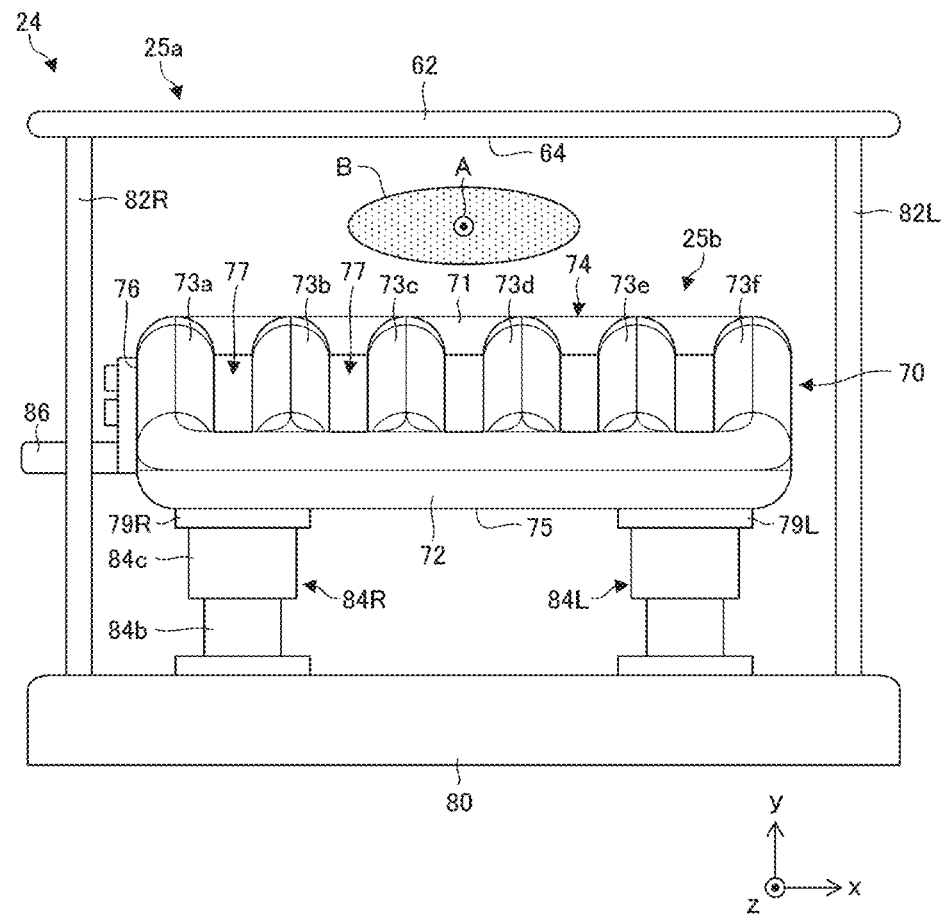
FIG. 4 is a front view showing the configuration of the beam park device of FIG. 3 in detail.

FIG. 4 is a front view showing the configuration of the beam park device 24 in detail. FIG. 4 is a view when the beam park device 24 is viewed from the downstream side to the upstream side of the beamline A and viewed from the position of mass analyzing slit 23.

The first park electrode 25a is supported by first support members 82L and 82R disposed on left and right of the second park electrode 25b. Similarly, the second park electrode 25b is supported by second support members 84L and 84R disposed on left and right. Mounting portions 79L and 79R are provided on a left portion and a right portion of the bottom surface 75 of the second park electrode 25b. The power supply connection portion 86 is mounted on the outer peripheral surface 76 of the second park electrode 25b. The power supply connection portion 86 extends in a direction (x direction) perpendicular to the outer peripheral surface 76.

The main body 70 of the second park electrode 25b includes the plurality of electrode bodies 73a, 73b, 73c, 73d, 73e, 73f (collectively referred to as the electrode bodies 73). The plurality of electrode bodies 73 are arranged to be spaced apart from each other in a right-left direction (x direction) viewed on the specification. That is, the plurality of electrode bodies 73 are arranged to be spaced apart from each other in a predetermined direction (x direction) perpendicular to both the extension direction (z direction) of the beamline A and the facing direction (y direction) of the park electrodes 25a and 25b. Each of the plurality of electrode bodies 73 extends from the upstream side to the downstream side of the beamline A, and extends in a direction (a direction along yz plane) perpendicular to the predetermined direction (x direction) in which the plurality of electrode bodies 73 are arranged, for example. A gap 77 penetrating the main body 70 from the second electrode surface 74 toward the bottom surface 75 is provided between each of the plurality of electrode bodies 73.

Edges or corner portions of the second electrode surface 74 of the second park electrode 25b are R-chamfered, and at least a portion of surfaces of the upstream connecting portion 71, the downstream connecting portion 72, and the electrode bodies 73 constituting the second electrode surface 74 is constituted by a convex curved surface. For example, at least a portion of the surfaces of the upstream connecting portion 71 and the downstream connecting portion 72 constituting the second electrode surface 74 is constituted by a cylindrical surface extending in the x direction. In addition, at least a portion of the surfaces of the electrode bodies 73 constituting the second electrode surface 74 is constituted by a cylindrical surface extending in the predetermined direction (direction along yz plane) perpendicular to the x direction.

Figure 5:
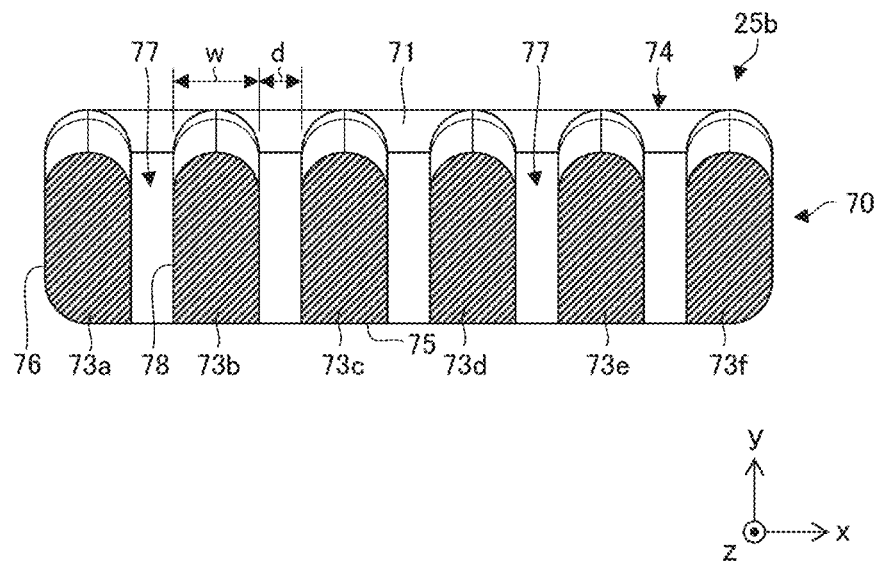
FIG. 5 is a cross-sectional view showing a configuration of a second park electrode.

FIG. 5 is a cross-sectional view showing a configuration of the second park electrode 25b and corresponds to the front view of FIG. 4. FIG. 5 shows the cross-sectional shape of each of the plurality of electrode bodies 73a to 73f. As shown in FIG. 5, upper surfaces of the electrode bodies 73a to 73f constituting the second electrode surface 74 are formed of convex curved surfaces, and have arc-shaped cross-sectional shapes. Meanwhile, a lower surface of each of the electrode bodies 73a to 73f constituting the bottom surface 75 has a flat surface. Further, a side surface 78 facing the adjacent electrode body of each of the electrode bodies 73a to 73f also has a flat surface. For example, the side surface 78 of the second electrode body 73b facing the adjacent first electrode body 73a is constituted by a flat surface.

Each of the plurality of electrode bodies 73a to 73f preferably has a sufficiently large width w which enables appropriate R-chamfering processing, and, for example, has a width w of 5 mm or more, and preferably, a width of 10 mm or more. A gap d (that is, a width of the gap 77) between each of the plurality of electrode bodies 73a to 73f is preferably a sufficiently large gap through which particles can easily fall. For example, the gap d is 5 mm or more, and preferably, 10 mm or more. For example, a curvature radius of the R-chamfering processing on the plurality of electrode bodies 73a to 73f is 5 mm to 30 mm.

In the shown example, the width w of each of the plurality of electrode bodies 73a to 73f is larger than the gap d between each of the plurality of electrode bodies 73a to 73f. For example, the width w of each of the plurality of electrode bodies 73a to 73f is about 10 mm to 30 mm, and the gap d between each of the plurality of electrode bodies 73a to 73f is about 5 mm to 15 mm. The width w of each of the electrode bodies 73 is set to be larger than the gap d between each of the electrode bodies 73, and thus, a more uniform electric field for deflection can be applied to the ion beam B. The width w of each of the electrode bodies 73 may be approximately the same as the gap d between each of the electrode bodies 73 or smaller than the gap d between each of the electrode bodies 73.

In the shown example, the widths w of the plurality of electrode bodies 73a to 73f in an arrangement direction (x direction) are equal to each other. The widths w of the plurality of electrode bodies 73a to 73f may be different from each other. For example, the widths of the electrode bodies (for example, the third electrode body 73c and the fourth electrode body 73d) in a center region near the beamline A may be relatively small, and the widths of the electrode bodies (for example, the first electrode body 73a and the sixth electrode body 73f) located at right and left ends away from the beamline A may be relatively large.

In the shown example, the gaps d between the plurality of electrode bodies 73a to 73f are equal to each other. The gaps d between the plurality of electrode bodies 73a to 73f may be different from each other. For example, the gap between the electrode bodies (for example, the third electrode body 73c and the fourth electrode body 73d) in the center region near the beamline A is relatively large, and the gaps between the electrode bodies (for example, the gap between the first electrode body 73a and the second electrode body 73b, and the gap between the fifth electrode body 73e and the sixth electrode body 73f) located at the right and left away from the beamline A may be relatively small.

Figure 6:
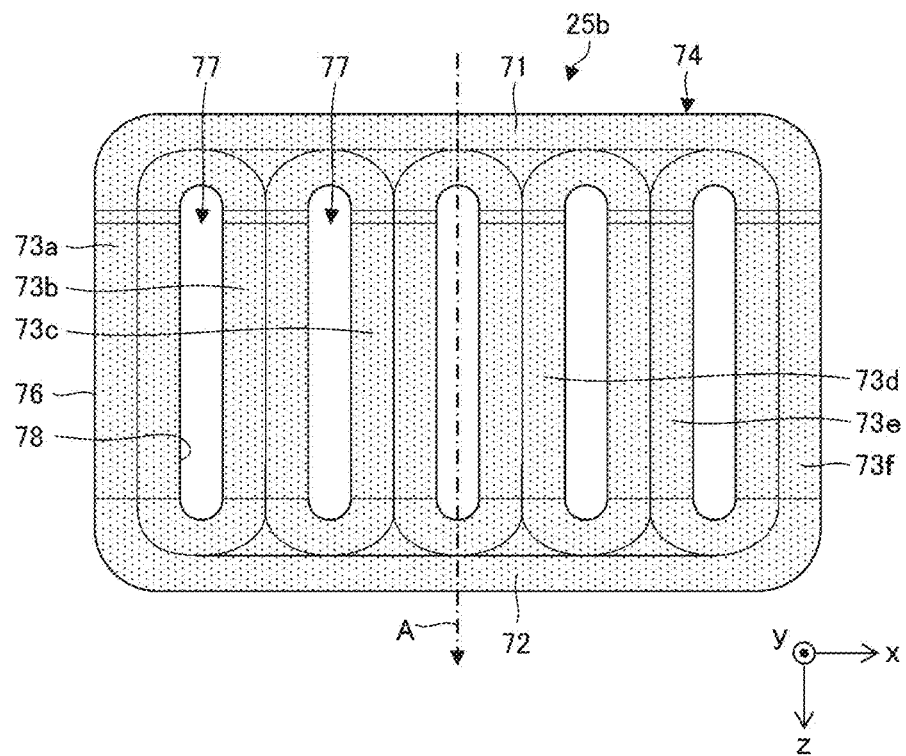
FIG. 6 is a top view showing the configuration of the second park electrode.

FIG. 6 is a top view showing the configuration of the second park electrode 25b, and shows a shape of the second electrode surface 74 when viewed from a position of the first park electrode 25a. In FIG. 6, the area occupied by the second electrode surface 74 is shaded for intelligibleness of the drawing. As shown in FIG. 6, the second electrode surface 74 is formed in a ladder shape. The outer peripheral surface 76 of the second park electrode 25b has a shape in which corner portions are R-chamfered. Moreover, the side surface 78 (or the inner circumferential surface) surrounding the gap 77 between each of the plurality of electrode bodies 73a to 73f also has a shape in which the corner portions are R-chamfered.

Figure 7:
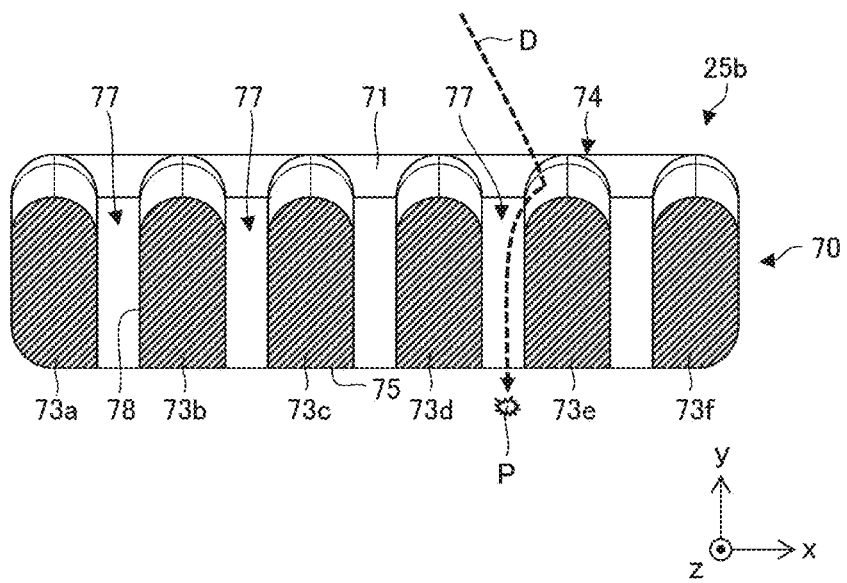
FIG. 7 is a view schematically showing a mechanism for suppressing adhesion of particles.

According to the above configuration, it is possible to suitably suppress adhesion of particles to the second electrode surface 74 of the second park electrode 25b. FIG. 7 is a view schematically showing a mechanism for suppressing adhesion of a particle P and corresponds to the cross-sectional view of FIG. 5. Inside the beamline unit 14, particles may be generated at various locations. For example, ions constituting the ion beam are deposited around the opening 23a of the mass analyzing slit 23 or on the beam dump 26, or the cover member 23d or the like is sputtered by the ion beam, and sublimated graphite or the like is deposited. A portion of the deposit may peel off, and particles may be generated. The generated particles may fall toward the second electrode surface 74 of the park electrode 25 on the lower side in the gravity direction.

In the second electrode surface 74, all of the main body 70, the upstream connecting portion 71, and the downstream connecting portion 72 have convex curved surfaces, and thus, the particle P reaching the second electrode surface 74 may fall along this convex curved surface. The second park electrode 25b has the gaps 77 penetrating the second park electrode 25b from the second electrode surface 74 to the bottom surface 75, and thus, the particle P falling along the convex curved surfaces falls below second park electrode 25b through the gaps 77 as shown by a broken line D. In this way, the adhesion (remaining) of the particle P to the second electrode surface 74 of the second park electrode 25b can be suppressed. As a result, it is possible to prevent occurrence of discharge between the park electrodes 25a and 25b due to particles adhering to the second electrode surface 74, and it is possible to prevent the particles from being scattered by the discharge and moving to the downstream side along the beamline A.

It should be understood that the invention is not limited to the above-described embodiment, but may be modified into various forms on the basis of the spirit of the invention. Additionally, the modifications are included in the scope of the invention. In addition, it is also possible to add rearrangement of combinations or procedures of processing as appropriate in each embodiment based on knowledge of those skilled in the art or a modification such as various types of design changes to the embodiment, and an embodiment to which such a modification is added can also be included in the scope of the present invention.

In the above-described embodiment, the case where the second park electrode 25b includes the main body 70, the upstream connecting portion 71, and the downstream connecting portion 72 is described. However, at least one of the upstream connecting portion 71 and the downstream connecting portion 72 may not be provided.

Figure 8:
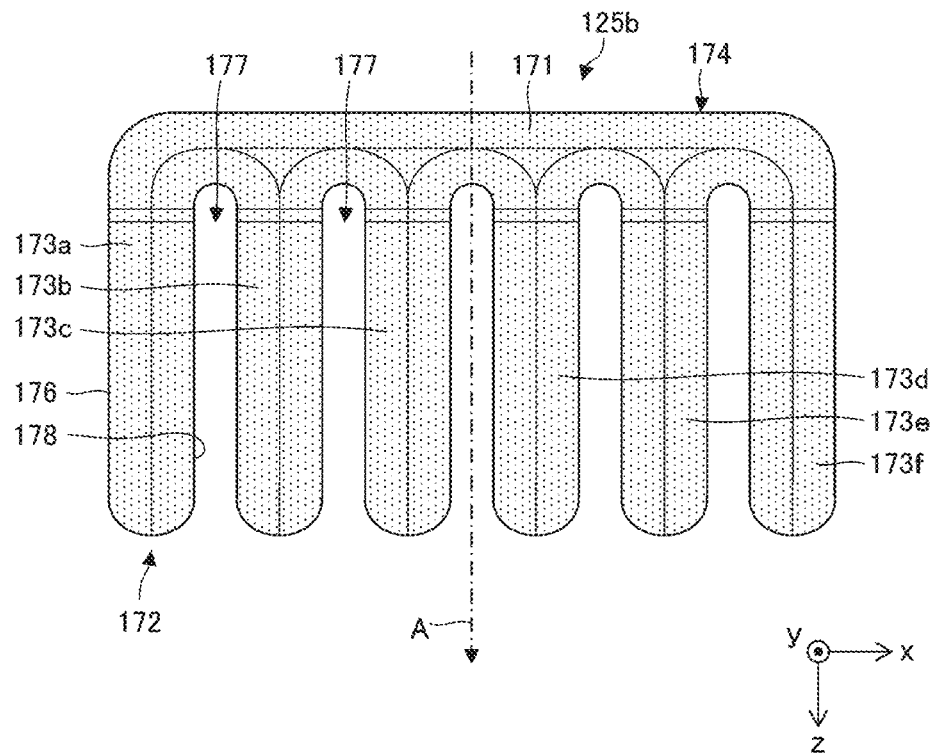
FIG. 8 is a top view showing a configuration of a second park electrode according to a modification example.

FIG. 8 is a top view showing a configuration of a second park electrode 125b according to a modification example and corresponds to the above-described FIG. 6. The second park electrode 125b according to the present modification example includes an upstream connecting portion 171 and a plurality of electrode bodies 173a, 173b, 173c, 173d, 173e, and 173f (collectively referred to as electrode bodies 173). As shown in FIG. 8, the second park electrode 125b is formed in a comb tooth shape, and upstream ends of the plurality of electrode bodies 173 are connected to each other by the upstream connecting portion 171, while downstream ends 172 of the plurality of electrode bodies 173 are not connected. Each of the downstream ends 172 of the plurality of electrode bodies 173 is configured to have a convex curved surface. Also in the present modification example, the same effect as the above-described embodiment can be obtained.

In the above-described embodiment, the case where all the second electrode surfaces 74 of the second park electrode 25b are constituted by convex curved surfaces is described. However, a portion of the second electrode surfaces 74 may be constituted by a flat surface. In the above-described embodiment, the case where the side surface (the outer peripheral surface 76 or the inner peripheral surface 78) of the second park electrode 25b is constituted by a flat surface is described. However, at least a portion of the side surfaces of the second park electrode 25b is constituted by a convex curved surface. For example, each of the plurality of electrode bodies 73 may be formed in a columnar shape, an oval columnar shape, or an elliptical columnar shape. A shape of a cross section perpendicular to an extension direction of each of the plurality of electrode bodies 73 may be circular, oval, or elliptical.

Figure 9:
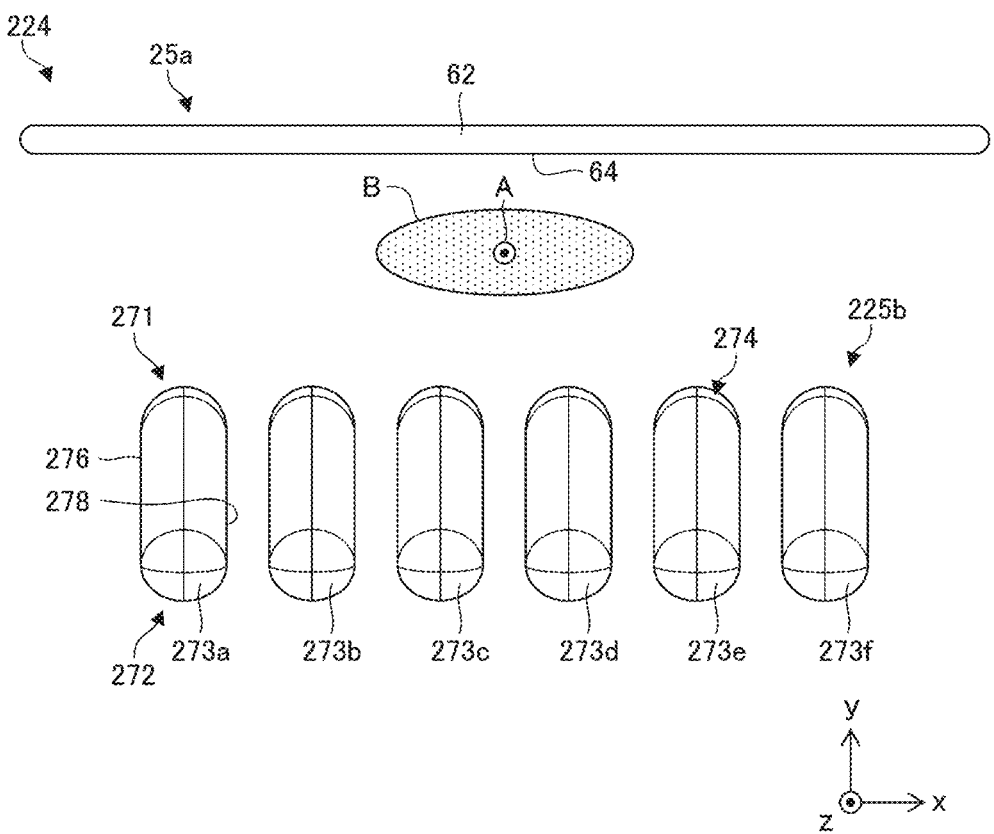
FIG. 9 is a front view showing a configuration of a beam park device according to another modification example.

FIG. 9 is a front view showing a configuration of a beam park device 224 according to another modification example and corresponds to the above-described FIG. 4. A second park electrode 225b of the present modification example has a plurality of electrode bodies 273a, 273b, 273c, 273d, 273e, and 273f (collectively referred to as electrode bodies 273) and does not have the upstream connecting portion or the downstream connecting portion. Each of the electrode bodies 273 is formed in a columnar shape, an oval columnar shape, or an elliptical columnar shape, and an upstream end 271 and a downstream end 272 of each of the electrode bodies 273 have convex curved surfaces. For example, each of the electrode bodies 273 is fixed to a structure such as the base plate 80 by structures similar to the mounting portion 79 and the second support member 84 shown in FIGS. 3 and 4. In addition, each of side surfaces 276 and 278 of each of the electrode bodies 273 is configured to have a convex curved surface. Also in the present modification example, the same effect as the above-described embodiment can be obtained.

In the above-described embodiment, the case where the first park electrode 25a located on the upper side in the gravity direction is constituted by the flat plate 62 is described. However, the first park electrode may have a plurality of electrode bodies which are disposed to be spaced apart from each other in a predetermined direction (x direction). The first park electrode may be formed in a ladder shape or a comb tooth shape, or may be constituted only by the plurality of electrode bodies disposed to be spaced apart from each other in the predetermined direction.

In the above-described embodiment, the case where the plurality of electrode bodies 73 extend in the direction perpendicular to the predetermined direction (x direction) is described. In a modification example, the plurality of electrode bodies may extend in an oblique direction intersecting the predetermined direction (x direction).

Figure 10A:
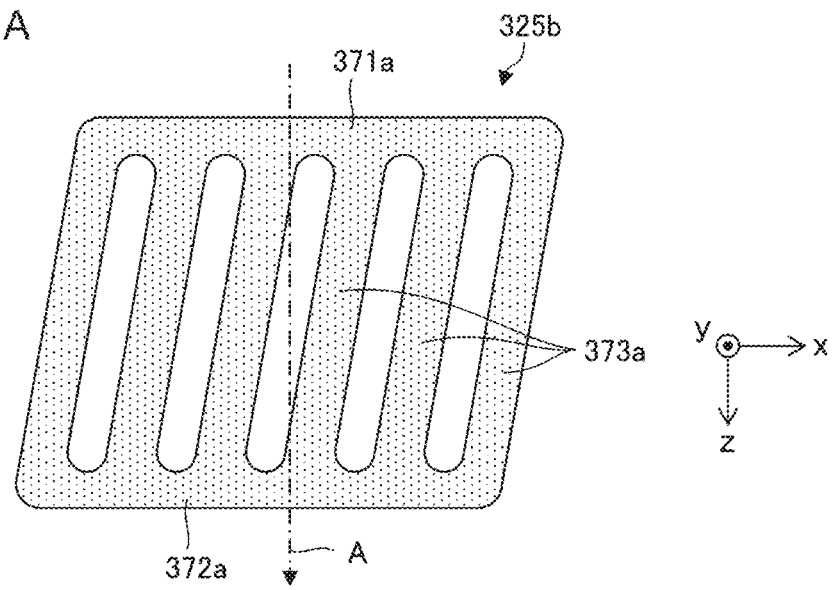
FIGS. 10A and 10B are top views showing a configuration of a second park electrode according to still another modification example.
Figure 10B:
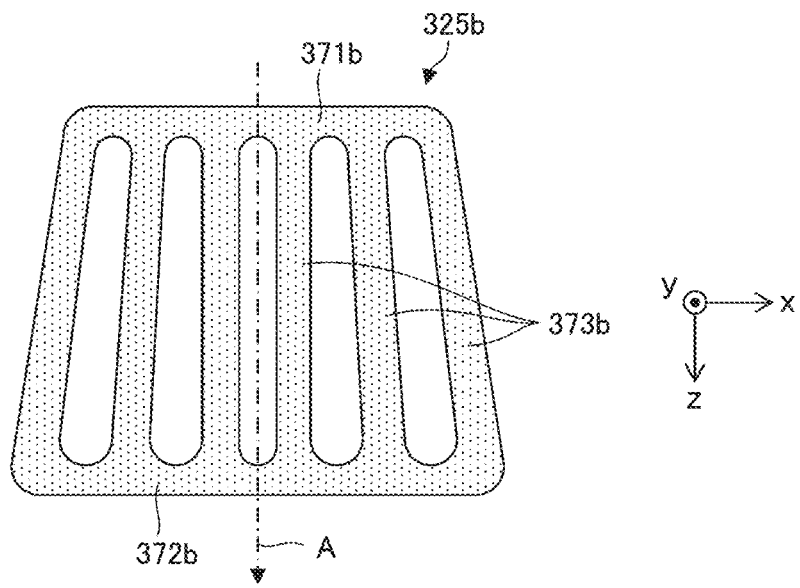

FIGS. 10A and 10B are top views schematically showing configurations of second park electrodes 325b according to still another modification example and correspond to the above-described FIG. 6. As shown in FIG. 10A, a plurality of electrode bodies 373a may extend obliquely with respect to the beamline A from an upstream connection portion 371a to a downstream connecting portion 372a, and the plurality of electrode bodies 373a may extend in parallel to each other. Moreover, as shown in FIG. 10B, while a portion of the plurality of electrode bodies 373b extends obliquely with respect to the beamline A from the upstream connecting portion 371b to the downstream connecting portion 372b, the remaining electrode body 373b may extend along the beamline A from the upstream connecting portion 371b to the downstream connecting portion 372b. In addition, a gap between each of the plurality of electrode bodies 373b may gradually increase from the upstream side to the downstream side. Conversely, the gap between each of the plurality of electrode bodies 373b may be gradually reduced from the upstream side toward the downstream side.

In the above-described embodiment, the case where the width w (thickness) of each of the plurality of electrode bodies 73 is uniform from the upstream end to the downstream end is described. In a modification example, the width w of each of the plurality of electrode bodies 73 may gradually increase from the upstream end toward the downstream end, or conversely may be gradually reduced from the upstream end toward the downstream end.

In the above-described embodiment, the case where the first park electrode 25a is constituted by the flat plate 62 and the first electrode surface 64 of the first park electrode 25a is flat is described. In a modification example, the first park electrode 25a is not constituted by a flat surface, and the first electrode surface 64 may be configured to have a curved shape or a stepped shape.

In the above-described embodiment, the case where the ion beam is deflected downward in the gravity direction when the beam park device 24 is operated in the second mode and the ion beam is retracted is described. In a modification example, the ion beam may be deflected upward in the gravity direction when the ion beam is retracted. In this case, the first park electrode to which a relatively positive voltage is applied is disposed on the lower side in the gravity direction, and the second park electrode to which a relatively negative voltage is applied is disposed on the upper side in the gravity direction. In this case, the first park electrode disposed on the lower side in the gravity direction is configured to have a plurality of electrode bodies disposed to be spaced apart from each other in the predetermined direction (x direction), and the first electrode surface facing the second park electrode may be constituted by a convex curved surface. Meanwhile, in the second park electrode disposed on the upper side in the gravity direction, the second electrode surface facing the first park electrode having the plurality of electrode bodies may be constituted by a flat surface, and the second electrode surface may not have the plurality of electrode bodies. In addition, each of the first park electrode and the second park electrode may have the plurality of electrode bodies.

What is claimed is:

1. An ion implanter having a beam park device on the way of a beamline through which an ion beam is transported toward a wafer, the beam park device comprising:
    a pair of park electrodes which faces each other across the beamline; and
    a beam dump which is provided away from the beamline in a facing direction of the pair of park electrodes and on a downstream side of the pair of park electrodes in a beamline direction,
    wherein at least one of the pair of park electrodes includes a plurality of electrode bodies which are disposed to be spaced apart from each other in a predetermined direction perpendicular to both a direction in which the beamline extends and the facing direction, and
    wherein each of the plurality of electrode bodies extends from an upstream side toward the downstream side in the beamline direction.

2. The ion implanter according to claim 1,
    wherein at least one of the plurality of electrode bodies extends in a direction perpendicular to the predetermined direction.

3. The ion implanter according to claim 1,
    wherein at least one of the plurality of electrode bodies extends obliquely with respect to the predetermined direction.

4. The ion implanter according to claim 1,
    wherein the facing direction of the pair of park electrodes is a gravity direction, and
    wherein the plurality of electrode bodies are provided in at least the park electrode of a lower side in the gravity direction.

5. The ion implanter according to claim 4,
    wherein the beam dump is provided at a position away from the beamline toward the lower side in the gravity direction.

6. The ion implanter according to claim 1,
    wherein one of the pair of park electrodes includes the plurality of electrode bodies, and
    wherein the other of the pair of park electrodes has a flat surface facing the plurality of electrode bodies across the beamline.

7. The ion implanter according to claim 1,
    wherein each of the pair of park electrodes includes the plurality of electrode bodies.

8. The ion implanter according to claim 1,
    wherein in each of the plurality of electrode bodies, at least an edge of a portion exposed toward one of the park electrodes facing each other across the beamline is R-chamfered.

9. The ion implanter according to claim 8,
    wherein a surface of the exposed portion of each of the plurality of electrode bodies has a flat surface and a curved surface which is R-chamfered.

10. The ion implanter according to claim 8,
    wherein a curvature radius of the R-chamfer of each of the plurality of electrode bodies is 5 mm to 30 mm.

11. The ion implanter according to claim 1,
    wherein at least one of side surfaces of the plurality of electrode bodies is a flat surface, and the at least one of side surfaces faces an adjacent electrode body in the predetermined direction.

12. The ion implanter according to claim 1,
    wherein a cross section perpendicular to an extension direction of at least one of the plurality of electrode bodies is circular, oval, or elliptical.

13. The ion implanter according to claim 1,
    wherein the park electrode including the plurality of electrode bodies further includes an upstream connecting portion which extends in the predetermined direction and connects upstream ends of the plurality of electrode bodies to each other, and in the upstream connecting portion, a portion exposed toward one of the park electrodes facing each other across the beamline is R-chamfered.

14. The ion implanter according to claim 1,
    wherein the park electrode including the plurality of electrode bodies further includes a downstream connecting portion which extends in the predetermined direction and connects downstream ends of the plurality of electrode bodies to each other, and in the downstream connecting portion, a portion exposed toward one of the park electrodes facing each other across the beamline is R-chamfered.

15. The ion implanter according to claim 1,
    wherein one of the pair of park electrodes is provided along the beamline, and
    wherein the other of the pair of park electrodes is provided obliquely with respect to the beamline to be away from the beamline and close to the beam dump in the facing direction as going toward the downstream side of the beamline.

16. The ion implanter according to claim 15,
    wherein an inclination angle of the park electrode provided obliquely with respect to the beamline is 10° to 30°.

17. The ion implanter according to claim 1,
    wherein the beam park device is operated to be switched to a first mode in which the pair of park electrodes is set to be the same potential and the ion beam passes through a portion between the park electrodes along the beamline to the downstream side, or a second mode in which a predetermined voltage is applied to between the pair of park electrodes and the ion beam is incident into the beam dump.

18. The ion implanter according to claim 1, further comprising:
    a mass analyzing magnet which is disposed on an upstream side of the beam park device in the beamline direction; and
    a mass analyzing slit which is disposed on a downstream side of the beam park device in the beamline direction and performs a mass analysis of the ion beam deflected by the mass analyzing magnet.

19. The ion implanter according to claim 1, further comprising:

a Faraday cup which is disposed on a downstream side of the beam park device and is capable of be inserted to the beamline to block the ion beam.

20. A beam park device which is disposed on the way of a beamline, the device comprising:
   a pair of park electrodes which faces each other across the beamline; and
   a beam dump which is provided away from the beamline in a facing direction of the pair of park electrodes and on a downstream side of the pair of park electrodes in a beamline direction,
   wherein at least one of the pair of park electrodes includes a plurality of electrode bodies which are disposed to be spaced apart from each other in a predetermined direction perpendicular to both a direction in which the beamline extends and the facing direction, and
   wherein each of the plurality of electrode bodies extends from an upstream side toward the downstream side in the beamline direction.

* * * * *